United States Patent [19]

Audesse et al.

[11] 4,282,559
[45] Aug. 4, 1981

[54] PHOTOFLASH UNIT HAVING FLASHLAMPS USING LOOPED LEAD-IN WIRES FOR RETENTION

[75] Inventors: Emery G. Audesse, Beverly, Mass.; Boyd G. Brower; Donald H. Pfefferle, both of Williamsport, Pa.; James L. Holmes, Montoursville, Pa.

[73] Assignee: GTE Products Corporation, Stamford, Conn.

[21] Appl. No.: 78,353

[22] Filed: Sep. 24, 1979

[51] Int. Cl.³ .................................................. G03B 15/02
[52] U.S. Cl. .................................... 362/15; 362/240; 362/241
[58] Field of Search .................... 362/15, 240, 241

[56] References Cited

U.S. PATENT DOCUMENTS 4,133,023  1/1979  Hanson .................................. 362/13
4,136,375  1/1979  Kewley .................................. 362/13

Primary Examiner—Stephen J. Lechert, Jr.
Attorney, Agent, or Firm—Lawrence R. Fraley

[57] ABSTRACT

A photoflash unit which includes a printed circuit board and a plurality of electrically-activated flashlamps. Each lamp includes a pair of lead-in wires each of which includes a looped portion for being frictionally inserted within an opening in the board to secure the lamp thereto. The looped portions may also be utilized to effect contact with the board's lamp-firing circuitry or separate portions of the wires may be crimped, bent, etc. to provide said contact.

11 Claims, 10 Drawing Figures

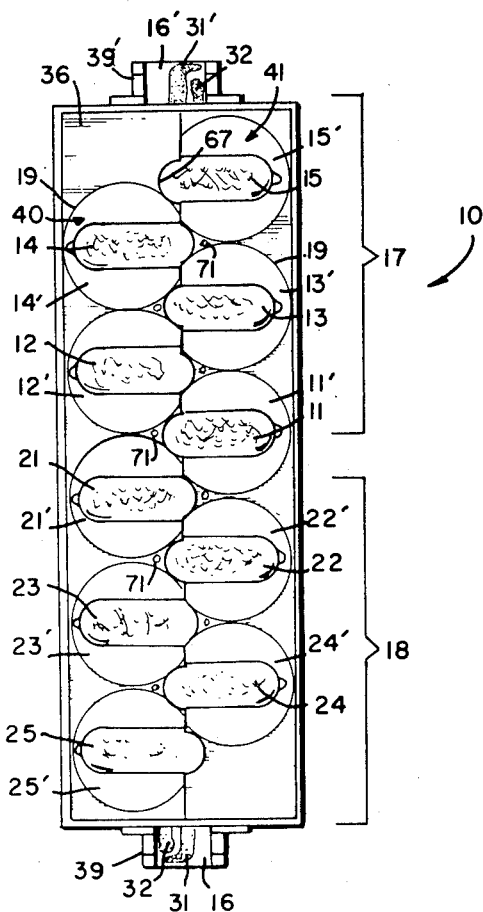
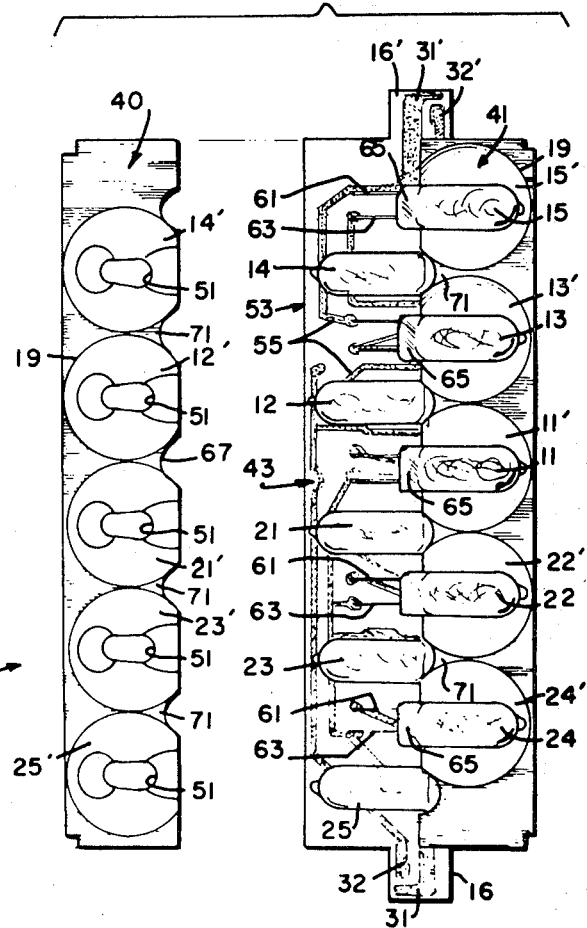
fig.1
fig.2

PHOTOFLASH UNIT HAVING FLASHLAMPS USING LOOPED LEAD-IN WIRES FOR RETENTION

DESCRIPTION

Technical Field

The present invention relates to disposable photoflash units and particularly to those of the multilamp variety which are electrically activated.

Several types of electrically-activated, multilamp photoflash units are available today for camera users. Among these are the popular "flashcube," the more recently introduced linear arrays known as "flashbars," and the vertically-oriented planar arrays commonly known as "flip-flash" devices. Examples of such units are illustrated in U.S. Pat. Nos. 3,327,105 (Kottler et al), 3,598,984 (Slomski), and 3,937,946 (Weber), respectively. As described therein, these units readily attach (e.g. by insertion within) to many of today's modern cameras and are activated by a suitable pulse provided by the cameras's power source. The amount of energy required to accomplish this activation is dependent on the type of flashlamp utilized in the unit. In the industry, these are typically classified into two varieties: low-voltage and high-voltage. Low-voltage photoflash lamps typically include a glass envelope with a combustion-supporting gas (e.g. oxygen) and a quantity of filamentary, combustible material (e.g. shredded zirconium or hafnium) therein. A pair of electrically conductive lead-in wires are usually sealed in one end of the envelope and extend therein. A filament wire is utilized and interconnects the extending ends of the lead-in wires. When the filament is heated by a firing current usually generated from a low-voltage source such as battery or charged capacitor (e.g. having a voltage of from about 1.5 to 15 volts), it ignites a primer material which then ignites the combustible material to produce a flash of light. Naturally, the oxygen gas aids in the above ignition.

High-voltage photoflash lamp usually employ one of two ignition structures both exclusive of the aforedescribed filament. In one embodiment, a glass or ceramic bead is located within the envelope and contains extending ends of the lamp's conductive lead-in wires therein. A quantity of primer material occupies a surface of the bead and bridges end portions of the leads which are located in the bead. Flashing of the lamp is achieved by application of a firing pulse approaching a few thousand volts across the portions of the lead-in wires which protrude from the envelope. The ignited primer material in turn ignites the combustible filamentary zirconium material also used in lamps of this variety. An example of such a lamp is illustrated in U.S. Pat. No. 3,959,860 (Schindler). In another embodiment, the glass bead is excluded with the primer material being directly applied to spaced-apart, spherical terminations of the lead-in wires' extending ends. These terminations are previously covered with a porous glass coating. Ignition is achieved in a similar manner to that of the above beaded lamp, by application of a high-voltage pulse across the two projecting lead-in wires. A spark discharge occurs between the two separate primer masses causing deflagration thereof and subsequent ignition of the adjacent zirconium or hafnium material. An example of a lamp utilizing such an ignition structure is illustrated in U.S. Pat. No. 4,059,389 (Armstrong et al.). In yet another type of high-voltage lamp, end portions of the lead-in wires are positioned on opposing sides of an indentation formed within the lamp's sealed end (bottom) portion with the primer material located within the indentation and interconnecting the two. Here also, combustible filamentary material is used and is ignited by the deflagrating primer. The teachings of the instant invention are particularly concerned with high-voltage lamps but may also be concerned with lamps of of the earlier generation, low-voltage variety.

BACKGROUND

In the more recent multilamp units such as the "flip-flash" devices, it has become common practice to utilize a printed circuit board (PCB) and to connect the lead-in wires from the unit's flashlamps to lamp-firing circuitry located on one of the PCB's surfaces. Heretofore, these connections have been accomplished primarily by using one of three methods. A first involves simply soldering the ends of the lead-in wires to the respective circuit paths or terminals. Understandably, this method requires added material as well as precisioned alignment between wires and terminals immediately prior to connection. A second technique involves use of added conductive components such as eyelets, rivets, etc. which are inserted in holes located in the PCB and the lead-in wires inserted therein. After insertion, the eyelets are crimped and bent to the desired configuration. An example of this method is described in U.S. Pat. No. 4,036,578 (Herman). This method has also proven disadvantageous due to the need for the described added parts as well as the requirement for the precise eyelet and lead-in wire alignment during eyelet positioning and crimping, respectively. Understandably, these latter steps are time-consuming and thus not readily adaptable to an industry which demands high production rates.

As described in U.S. Pat. No. 4,028,798 (Bechard et al.), a third technique for connecting lead-in wires to circuitry on a PCB has been to embed the wires within the PCB's substrate such that portions thereof physically contact the circuitry either on a bottom surface or by impression across an upper (top) surface. One problem of such a method has been the ready possibility of faulty connection due primarily to inadequate substrate deformation. Such a technique also fails to readily lend itself to manufacture of a miniaturized, final product because of the need for relatively large spaces on the substrate for securement of each lamp.

It is believed therefore that a photoflash unit which provides for positive securement and alignment of the unit's lamps to the unit's PCB without the several disadvantages cited above would constitute a signifcent advancement in the art. As will be described, the securement means of the instant invention also provides positive connection of the unit's lamps to the lamp-firing circuitry of the PCB component.

DISCLOSURE OF THE INVENTION

It is a primary object of the present invention to provide an electrically-activated photoflash unit which assures positive securement and electrical connection of the unit's lamps to the PCB component without the need for added items or material such as solder, eyelets, rivets, etc. and the problems associated therewith.

It is another object of the invention to provide such a unit which can be readily and economically produced.

Still another object of the invention is to provide a unit of the type described which is both compact in design and relatively simple to operate.

These objects are accomplished in one aspect of the invention by provision of a photoflash unit which comprises a circuit board including an insulative substrate member with lamp-firing circuitry located on one surface thereof. The unit's lamps are secured to the substrate by providing at least one of the lamp's lead-in wires with a looped portion which is frictionally inserted within an opening located in the substrate adjacent the lamp-firing circuitry. The loop may serve to contact the lamp-firing circuitry or the function may be performed by another portion of the lead-in wire.

BRIEF DESCRIPTION OF THE DRAWINGS

FIG. 1 is a front elevational view of a photoflash unit in accordance with one embodiment of the invention;

FIG. 2 is an exploded front elevational view of the photoflash unit of FIG. 1, excluding the unit's front and back housing members.

BEST MODE FOR CARRYING OUT THE INVENTION

Figure 3:
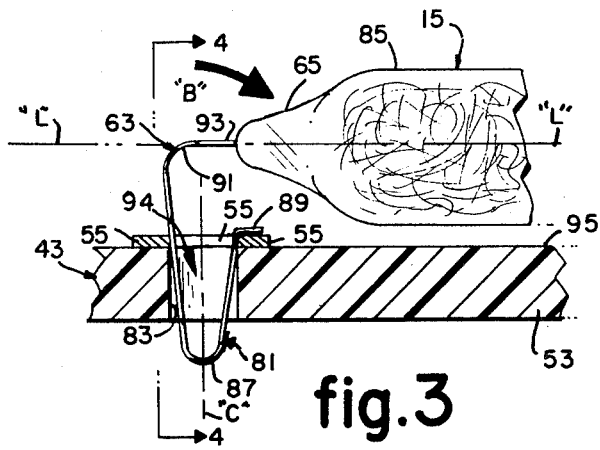
FIGS. 3–10 represent various techniques for securing the conductive lead-in wires of the lamps of the unit shown in FIGS. 1 and 2 to the unit's printed circuit board component such that the lamps are maintained in alignment thereon and are electrically connected to the board's lamp-firing circuitry.

For a better understanding of the present invention together with other and further objects, advantages and capabilities thereof, reference is made to the following disclosure and appended claims in connection with the above-described drawings.

The concepts of the present invention are particularly useful as embodied in a photoflash unit of the type referred to as a "flip-flash." An earlier version of such a unit is described in U.S. Pat. No. 4,017,728 (E. G. Audesse et al.) wherein a planar array of eight high-voltage flashlamps (two groups of four) are utilized. A more recent embodiment, and one to which the teachings of the invention are especially directed, is described in U.S. Pat. No. 4,164,007 (E. G. Audesse et al.) wherein a total of ten lamps are used. While this latter version will be defined with regard to the present invention, it is to be understood that the teachings of this invention readily apply to different types of photoflash units, including the earlier eight lamp configurations. Both of the above patents are assigned to the assignee of the present invention.

FIGS. 1 and 2 illustrate portions of a multilamp photoflash unit 10 which is similar in general operation to that described in the aforementioned U.S. Pat. No. 4,017,728 except that the construction has been modified to include two additional lamps in a housing having approximately the same outer dimensions. Whereas the unit described in U.S. Pat. No. 4,017,728 includes a planar array of eight high-voltage type flashlamps with associated reflector cavities provided in a single reflector member, unit 10 comprises a planar array of ten high-voltage flashlamps 11–15 and 21–25 mounted on a printed circuit board 43, with an array of respectively associated reflector cavities 11'–15' and 21'–25' disposed therebetween. The lamps are mounted in two parallel columns, and the reflector cavities are provided on a pair of strip-like panels 40 and 41 which are conveniently separable for assembly purposes. The array is provided with a plug-in connector tab 16 at the lower end thereof which is adapted to fit into a camera or flash adapter (not shown). A second plug-in connector 16' is provided at the top of the unit, whereby the array is adapted to be attached to the camera socket in either of two orientations (e.g., with either the tab 16 or the tab 16' plugged into the socket). The lamps are arranged in two groups of five disposed on the upper and lower halves respectively, of the elongated, rectangular-shaped array. Upper group 17 comprises lamps 11–15, and lower group 18 includes lamps 21–25. The reflector cavities are disposed behind the respective lamps so that as each lamp is flashed, light is projected forward of the array. The lamps are arranged and connected so that when the array is connected to a camera by the connector tab 16, only the upper group 17 of lamps will be flashed, and when the array is turned end for end and connected to the camera by the other connector tab 16', only the then upper group 18 of the lamps will be flashed. By this arrangement, only lamps relatively far from the camera lens axis are flashable, thus reducing the well known, undesirable red-eye effect.

The construction of the array includes front and back housing members (only the front housing is shown in FIG. 1 and represented by the numeral 36) which preferably are made of plastic and are provided with interlocking members which are molded integrally within the housing members and which lock these members together in final assembly to form a unitary flash array structure. In the preferred embodiment as shown, the front (or cover) housing member is a rectangular concavity and the back housing member is substantially flat and includes integral extensions 39 and 39' (FIG. 1) at the ends thereof which partly surround and protect the connector tabs 16 and 16' and also function to facilitate mechanical attachment to the camera socket. Sandwiched between the front and back housing members are the flashlamps, the pair of adjacent strip-like reflector panels 40 and 41 (preferably each being an aluminum-coated plastic molding shaped to provide the individual reflector cavities), and printed circuit board 43 provided with integral connector tabs 16 and 16'. An insulating sheet may be positioned between the reflector and circuit board components in accordance with the teachings of earlier, "flip-flash" devices. Similarly, an indicia sheet may also be used, said sheet typically located between the circuit board and back housing components. The indicia sheet may be provided with information, trademarks, and other indicia such as flash indicators located behind the respective lamps which change color due to heat and/or light radiation from an adjacent, flashed lamp to thus indicate to the unit's user which of the lamps have been flashed and not flashed.

Referring to FIG. 2, window means, such as openings 51, are provided in each of the reflector cavities behind the lamp aligned therewith. Circuit board 43, which includes an insulative substrate 53 having desired patterns of lamp-firing circuitry 55 thereon, is provided with corresponding openings (not shown) to facilitate radiation from the flashlamps reaching the flash indicators. The rear housing member is transparent (either of clear material or provided with window openings) to permit viewing of the indicia on the described indicia sheet. The front housing is also transparent, at least in front of the lamps, to permit light from the flashing lamps to emerge forwardly of the array. This housing may be tinted to alter the color of the light from the flashlamps.

The height and width of the rectangular array are substantially greater than its thickness, and the height and width of the reflector panels, insulating sheet, and circuit board are substantially the same as the interior height and width of the front housing member to facilitate holding these parts in place.

Tab 16, which is an integral part of circuit board 43, is provided with a pair of electrical circuit terminals 31 and 32. Similarly, tab 16' is provided with a pair of terminals 31' and 32'. The function of these terminals is to connect the lamp-firing circuitry 55 of board 43 to corresponding terminals in a camera socket whereas firing voltage pulses can be applied to the array. The terminals 31 and 31' are shown as having substantially J-shaped configuration for temporarily shorting the socket terminals while the array is being plugged in and therefore discharge any residual voltage charge in the firing pulse source. In addition, this serves to reduce the likelihood of lamps being accidentally flashed by electrostatic voltage during handling of the array.

As stated, the circuit board 43 includes a "printed circuit" (lamp-firing circuitry 55) thereon for causing sequential flashing of the unit's lamps by firing voltage pulses applied to the terminals 31, 32 or 31', 32'. Circuitry 55 may be functionally similar to that described in the aforementioned U.S. Pat. No. 4,017,728 except for extending the circuitry to accommodate an additional lamp in each half of the printed circuit board. Accordingly, the top and bottom halves of the circuitry are preferably reverse mirror images of each other. The lead-in wires 61 and 63 of each of the lamps are attached to the circuit board in accordance with the new and unique teachings of the instant invention, which will be described in greater detail below with the description of FIGS. 3–10. These wires underlie the reflector panels and pass through suitable openings (not shown) in the insulating sheet (if provided). As will be defined, the lead-in wires of each lamp are secured within the board's substrate member 53 and electrically connected to circuitry 55 at desired locations thereof. This securement and connection is not shown in FIG. 2 for purposes of clarity.

As further described in U.S. Pat. No. 4,017,728, the circuitry of board 43 includes radiation switches (not shown) which are in contact with and bridge designated circuit runs. The material for the radiation switches may be suitable material initially having an open circuit or high resistance, the resistance thereof becoming zero or of a low value when the material receives radiation in the form of heat and/or light from a respective adjacent lamp when the lamp is flashed. For this purpose, each of the radiation switches is positioned behind and near a respective flashlamp (e.g. 11, 12, 13, 14). Window means in the form of transparent sections or the illustrated openings 51 are provided in the reflector cavities in front of the switches to facilitate radiation transfer. Accordingly, as illustrated, openings 51 are preferably somewhat elongated to accommodate radiation transfer for both the indicators and switches. A suitable material for the radiation switches is silver oxide dispersed in a binder such as polyvinyl resin. Each of the radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the circuitry on the upper part of the circuit board. The circuitry runs from the plugged-in terminals at the lower part of the board and extends upwardly so as to activate the circuitry in the upper half of the circuitry board. Similarly, when the unit is turned around and tab 16' is plugged into a socket, the board's terminals will be connected to and activate the lamps which will then be in the upper half of the flash unit. This accomplishes, as has been stated, the desirable characteristic whereby only the group of lamps relatively farthest away from the camera lens axis will be flashed, thereby reducing any undesirable red-eye effect.

In a manner generally similar to that described in the aforementioned "flip-flash" patent, unit 10 functions as follows. Assuming that none of the five lamps in the upper half of the unit have been flashed, upon occurrence of the first firing pulse applied across the terminals 31 and 32, this pulse will be directly applied to the lead-in wires of the first connected flashlamp 11, whereupon this lamp flashes and becomes an open circuit between its lead-in wires. Heat and/or light radiation from the flashing first lamp causes the adjacent first radiation switch to become a closed circuit (or a low value of resistance), thereby connecting the circuit board terminal electrically to a lead-in wire of the second lamp 12. By the time this occurs, the firing pulse has diminished to a value insufficient to cause the second lamp 12 to flash. When the next firing pulse occurs, it is applied to the lead-in wires 61 and 63 of the second lamp 12 via the now closed radiation switch. Accordingly, the second lamp 12 flashes, causing an adjacent second radiation switch to assume zero or low resistance. The second lamp now has an open circuit or high resistance between its lead-in wires. When the next firing pulse occurs, it is applied via the now closed second radiation switch to the third lamp 13, thereby firing the lamp which becomes an open circuit, and the radiation from it causes an adjacent third radiation switch to become essentially a closed circuit across its terminals. Thus, the next firing pulse will be applied via the now closed third-radiation switch to the lead-in wires of the fourth flashlamp 14, thereupon causing that lamp to flash. The fourth lamp then becomes an open circuit, and the radiation from it causes an adjacent fourth radiation switch to become essentially a closed circuit across its terminals. The next (fifth) firing pulse will be applied via the now closed fourth radiation switch to the lead-in wires 61 and 63 of the fifth flashlamp 15, thereupon causing this lamp of group 17 to flash. When unit 10 is inverted and connector tab 16' inserted within the camera socket, group 18 of the lamps then becomes uppermost and relatively farthest away from the camera's lens axis. This group will thus be in the active circuit and will be flashed in the same manner as has been described. In a preferred embodiment, the lamps are high voltage types requiring about 2,000 volts, for example, at low current for flashing, and can be fired by impacting or stressing a piezoelectric element in the camera.

Each of the soft glass flashlamps as utilized in the ten-lamp configuration according to one embodiment of the present invention preferably includes a tubular envelope of type 0010 or 0012 glass having a thickness of about 32 mils and a diameter of about 0.325 inch for the finished (coated) lamp, a length of about 0.925 inch (thus slightly shorter than flashlamps used in eight-lamp arrays), an internal volume of about 0.4 cc, an oxygen pressure of 725 cm Hg (9.5 atmospheres), and a shredded zirconium fill of about 14 mgs. Typical unit package dimensions within which the previously mentioned eight-lamp arrays were housed and within which the present ten-lamp array of unit 10 is housed are as follows: overall width of the unit, about 1.75 inches; thickness, about 0.56 inch; and overall length (not including extensions 39 and 39'), about 4.94 inches. The unit's length including these extensions is about 5.47 inches.

In the lamp configuration according to the invention, the planar array of ten tubular photoflash lamps 11–15 and 21–25 are arranged in two parallel columns with the lamps horizontally disposed and the lamps of one column staggered relative to the lamps of the other column. Each of the lamps have a base defined by a pinch seal 65 from which the lead-in wires 61 and 63 project to be connected to lamp-firing circuitry 55 in the manner defined below. The column of lamps 15, 13, 11, 22, and 24 are positioned with their respective bases interdigited with the bases of the adjacent column of lamps 14, 12, 21, 23, and 25. In this manner, the bases of one column of lamps face the adjacent column of lamps. It is evident that this arrangement of staggered interdigitation has the effect of compacting the width of the array. Of course, this mode of compacting the array could have been ccomplished by arranging the adjacent columns of lamps tip-to-tip or base-to-tip. However, the base-to-base configuration, in cooperation with the reflector arrangement described, enables a maximization of the light output obtainable from each lamp-reflector module.

As best illustrated in FIGS. 1 and 2, the reflector system comprises a pair of adjacent strip-like reflector panels 40 and 41, each associated with a respective one of the columns of lamps, and each having a column of side-by-side lamp-receiving cavities on its front side formed with reflecting surfaces defining individual lamp reflectors which respectively are aligned behind the lamps associated therewith. More specifically, reflector panel 40 contains the cavities 14', 12', 21', 23', and 25', which are respectively aligned behind the column of lamps 14, 12, 21, 23 and 25. Similarly, reflector panel 41 contains cavities 15', 13', 11', 22', and 24', which are respectively aligned behind the column of lamps 15, 13, 11, 22, and 24. The individual reflector cavities of one panel are staggered relative to the individual reflector cavities of the other panel, and each reflector panel is foreshortened with respect to the lamps associated therewith, as particularly illustrated by panel 41 with respect to its associated column of lamps in FIG. 2. More particularly, in this embodiment the reflector cavities each have a substantially circular aperture 19 having a diameter of about 0.868 inch. The foreshortening of the reflector panel facing the adjacent reflector panel such that the width of the reflector panel is about 0.773 inch at the aperture plane. In this manner, as shown in FIG. 2, the base portions 65 of the lamps tend to project beyond the edge of the associated reflector panel. Accordingly, when adjacent reflector panel 40 is assembled in abutment with panel 41, panel 40 covers the lead-in wires 61 and 63, in addition to substantial portions of the bases 65 of the lamps associated with panel 41. Hence, with respect to all lamps of the array, the non-light-emitting portions of the lamps are covered by reflector panel surfaces. More specifically, the lead-in wires and base portions of all lamps associated with panel 41 underlie the adjacent panel 40 to be hidden thereby, and the lead-in wires and bases of the lamps associated with panel 40 underlie adjacent panel 41 to be hidden thereby. In order to assure yet additional maximization of light output, the reflector panels, as illustrated, may also have a plurality of cut-outs 67 located along the edge thereof facing the adjacent panel and respectively aligned with the individual reflector cavities of that adjacent panel for exposing light-emitting portions of the lamps adjacent to the covered bases thereof. More specifically, the cut-outs 67 along the edge of each panel comprise arcuate recesses between the circular apertures 19.

Reflector panels 40 and 41 are preferably provided with conductive projections 71 which are disposed on the front face of each panel between the circular apertures and adjacent the arcuate recesses 67. These projections fit through openings in the front face of the front housing member 36. As each reflector panel has a conductive metallic coating over its entire front surface which may be connected, such as by a wire (not shown), to the ground circuit including terminals 31 and 31', the projections 71 provide static grounding protection for the unit by assuring electrical contact with any charged object, such as a user's hand, which may touch the front of the array housing.

In accordance with the present invention, a new and unique means is provided for securing the lead-in wires 61 and 63 to the insulative substrate member 53 of board 43 and for also electrically connecting each of these wires to lamp-firing circuitry 55 at designated locations thereon. This new and unique means of combined securement and connection, as illustrated in various embodiments in FIGS. 3–10, is possible without the need for added materials and items such as solder, metal eyelets, rivets, etc.

With particular regard to the embodiment of FIG. 3, a flashlamp (e.g. 15) is secured to substrate 53 of board 43 by providing each lead-in wire (only wire 63 is shown) with a looped portion 81 and frictionally inserting portion 81 within an opening 83 located in substrate 53 adjacent the light-transmitting envelope 85 of lamp 15. The closed end 87 of looped portion 81 faces away from lamp 15 and therefore exists opening 83 on the side of substrate 53 opposite circuitry 55. Frictional retention of wire 63 is assured due to the continual tendency of the wire to expand (springback) in an open direction and the sides of opening 83 preventing such motion. As shown, closed end 87 projects below the bottom surface of member 53. In the foregoing description, as well as that of the embodiments of FIGS. 4–10, the reflector, indicia sheet, insulating sheet, and housing components of unit 10 are not illustrated for purposes of clarity and simplicity. Looped portion 81 also serves to electrically connect lamp 15 to circuitry 55. The circuitry, as shown, runs to the upper edge of opening 83 and is thus positively engaged by both leg portions of the loop. Contact is further enhanced by provision of a foot portion 89 at the end of wire 63. Foot 89 also aids in positioning loop 81 within opening 83 by assisting in preventing the loop from moving downward therein. It is understood, however, that the loop itself provides sufficient frictional retention to prevent such displacement under normal handling conditions. After insertion of loop 81 within opening 83, the lamp envelope 85 is bent (direction "B") at approximately ninety degrees at location 91 on wire 63 such that a linear portion 93 of the wire which projects immediately from seal 65 will lie perpendicular to the axis "C" of opening 83. Linear portions 93 lies in the same plane as the longitudinal axis "L" of lamp 15 and traverse the open ends 94 of loops 81. Accordingly, this axis is also perpendicular to axis "C," in addition to being parallel to the upper, planar surface 95 of substrate 53. It was found, surprisingly, that the above, bent orientation facilitated contact between the leg portions of loop 81 and circuitry 55 in addition to also increasing the frictional (retention) force between the walls of opening 83 and these leg portions. This occurred as a result of added pressure on loop 81 to expand (open).

Positioning of wires 63 is achieved by utilization of staking tools (not shown) which each include a tipped end of approximately the same configuration as loop 81. Wires 63 are each horizontally aligned above a respective opening 83 while the wires are still of a straight, non-bent shape. Each of the described staking tools engages one of the wires to cause the illustrated deformation (loop) therein and simultaneously insert the loop within opening 83. Subsequent to removal of the staking tools, the lamp envelopes 85 are bent downward in the orientation shown in FIG. 3.

Figure 4:
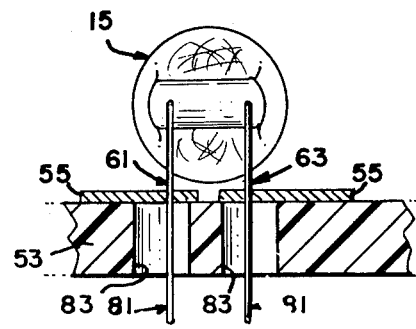

FIG. 4, taken along the line 4—4 in FIG. 3, is provided to illustrate the positioning relationship of both lead-in wires 61 and 63 as viewed from the press end 65 (FIG. 3) of lamp 15. As shown, each wire is located within a respective opening 83 and engages a separate circuit path of circuitry 55. The lead that engages the common portion of said circuitry may be forced further down than the other lead in order to contact the unit's conductive indicia sheet. Although openings 83 are illustrated as being substantially cylindrical, it is understood that each may assume a different configuration (e.g. rectangular) and still permit proper positioning of wires 61 and 63.

Figure 5:
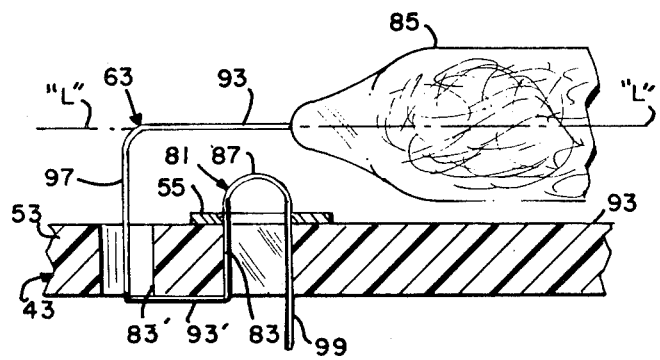

In the embodiment of FIG. 5, the positioning of looped portion 81 of wire 63 is reversed in comparison to that of FIGS. 3 and 4, with the closed end 87 exiting opening 83 immediately adjacent envelope 85. A second, smaller opening 83' is provided in substrate 53 adjacent first opening 83 and serves to accommodate a straight section 87 of wire 63. Wire 63 is also bent at the aforedescribed ninety degree angle whereby the linear, projecting portion 93 will lie perpendicular to the parallel axes of openings 83 and 83'. Lamp axis "L" is also parallel to surface 93, as in FIG. 3. Opening 83' lies parallel to opening 83 and preferably possesses a diameter of 0.040 inch while opening 83 is a 0.047×0.076 inch rectangle. Loop 81 effects contact at its closed, projecting end with circuitry 55, which in turn runs to the upper (front) edge of first opening 83. Loop 81 and straight section 97 are interconnected by a second linear portion 93' which forms an angle of ninety degrees with section 97 and thus lies parallel to the first linear, projecting portion 93. Positioning of wire 63 is achieved by first threading the wire (while of straight configuration) through first opening 83' and bending the wire to lie flush with the bottom (back) surface of substrate 53 such that part of the wire lies across the adjacent opening 83. The aforedescribed staking tool is next utilized to move upwardly and simultaneously form and insert looped portion 81. Envelope 85 is then bent across the closed end of loop 81 to lie parallel to board 43. An advantage of the embodiment of FIG. 5 is that it results in a straight, protruding end 99 which extends from the lower surface of substrate 53 and can be utilized to make contact with the unit's conductive indicia sheet (not shown) to enhance grounding of circuitry 55. Understandably, only one of wires 61 and 63 can provide this function in accordance with the above description of the operation of unit 10, since only one lead is common.

Figure 6:
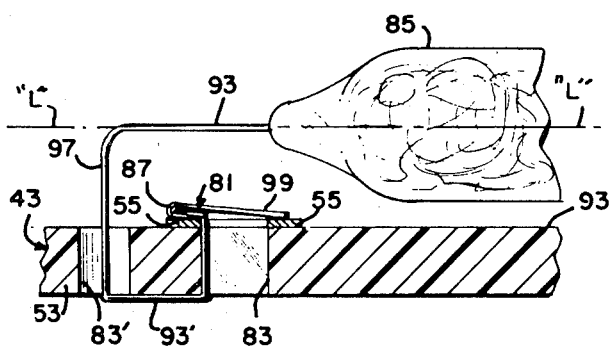

The configuration of FIG. 6 is substantially similar to that of FIG. 5 with the exception that the closed end 87 of loop 81 is crimped downwardly onto circuitry 55 to thus assure positive contact thereto. In addition, this substantially closed loop configuration promotes lamp securement in that at least three sides (one having circuitry 55 thereon) of substrate 53 are engaged. Further, this arrangement promotes contact with circuitry 55 in that the formerly protruding end 99 is oriented to extend downward force against the upper surface of circuitry 55 rather than an abutting-type contact as described above.

Figure 7:
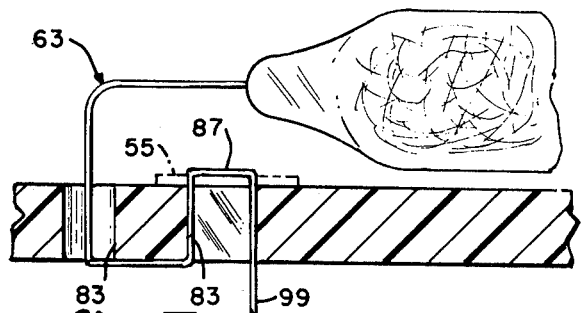
Figure 8:
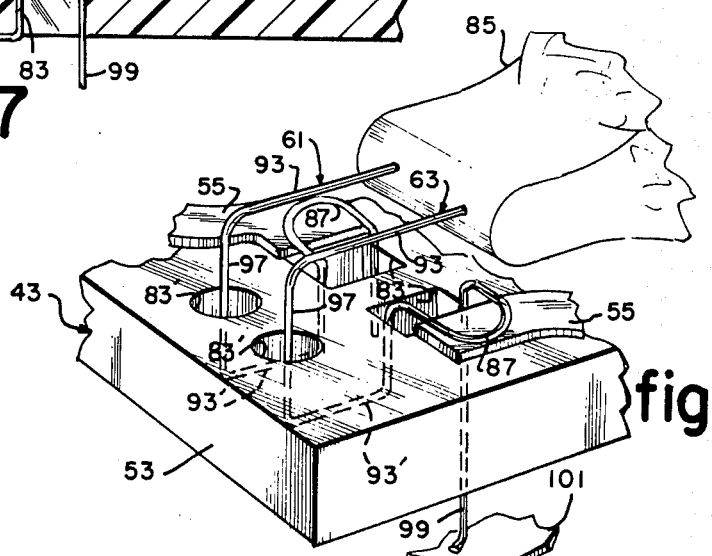

The embodiment of FIGS. 7 and 8 is also substantially similar to that of FIG. 5 except that the protruding, closed ends 87 of loops 81 are bent outwardly in relation to the respective planes occupied by the remaining portions of the wires 61, 63 to contact respective paths of circuitry 55. It is understood that the embodiment shown in perspective in FIG. 8 is the same as that shown in elevation in FIG. 7 (wherein only one wire 63 is illustrated). Rectangular slots are used for openings 83 while openings 83' retain a cylindrical configuration. A protruding end 99 is also provided at the end of wire 63 to provide the described grounding functions and improved electrostatic protection (by contact with indicia sheet 101).

Figure 9:
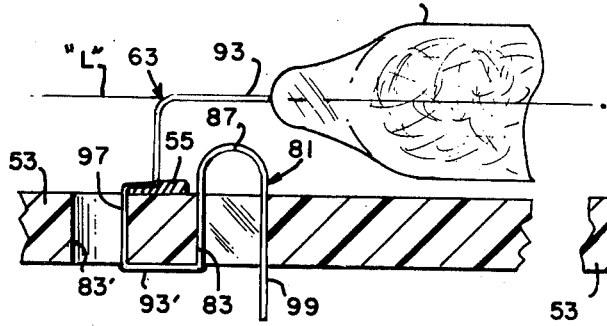

The embodiment of FIG. 9, also similar in many respects to FIG. 5, provides for electrical contact with circuitry 55 by a part of wire 63 other than looped portion 81. That is, straight section 97 is offset immediately above opening 83' downwardly against circuitry 55. This circuitry, as shown, runs to the upper edge of opening 83'. The configuration of FIG. 9 is ideal in that it results in a four-sided engagement on substrate 53. That is, wire 63 engages a wall of each of the openings 83 and 83', the bottom (back) surface of the substrate, and the circuitry 55 located in physical contact with the upper surface of the substrate. Downward force against circuitry 55 by the described offset portion is assured by the final bending of envelope 85 to the preferred parallel orientation. As also shown in FIG. 9, this final orientation results in the linear portion 93 of wire 63 traversing the projecting, closed end 87 of loop 81.

Figure 10:
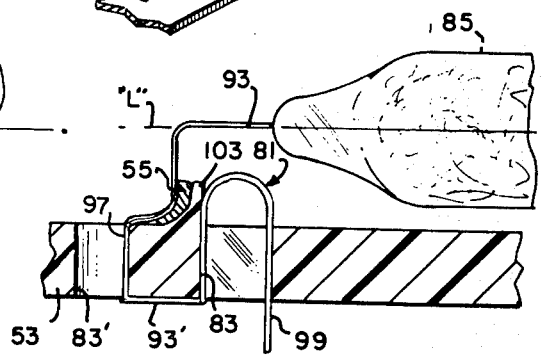

In FIG. 10, the arrangement is similar to that of FIG. 9 with the exception that loop 81 aids in providing contact to circuitry 55. The circuitry is located on a web portion 103 of substrate 53 to partially cover opening 83 prior to insertion of loop 81. Loop insertion (and formation) results in an upward deflection of web 103 whereupon circuitry 55 located thereon will more positively engage the protruding offset portion in section 97. This embodiment removes the necessity for locating the circuitry paths (or runs) immediately adjacent the upper edges of the described openings 83 or 83'. In a preferred embodiment, web 103 actually formed a closure for opening 83 and was broken away by the staking operation which formed loop 81. This latter arrangement further facilitates positioning of lamp-firing circuitry 55 on substrate 53, said circuitry typically applied in paste-like form and subsequently dried.

The preferred material for substrate 53 is impact polystyrene while that of wires 61 and 63 is Niron 52. The remaining components for the lamp for use in unit 10 have been described. It is understood that the above plastic material for substrate 53 possesses a degree of hardness much less than that of wires 61 and 63. However, this is not necessary for successful operation of the invention in that deformation of the substrate (e.g. at the interior walls of openings 83) is not essential or desired.

Thus there has been shown and described a multi-lamp photoflash unit which utilizes a new and unique means of securing and electrically connecting the unit's flashlamps to a corresponding circuit board. The invention as defined is also understandably cheaper to produce and more readily capable of being manufactured at high production rates than the aforedescribed prior art units.

While there have been shown and described what are at present considered the preferred embodiments of the invention, it will be obvious to those skilled in the art that various changes and modifications may be made therein without departing from the scope of the invention as defined by the appended claims. For example, the invention in its simplest form, can comprise only a circuit board and lamp components with minor modification to the board's substrate member to provide seating upon the respective camera. As such, the substrate could include formed sides or similar structure to serve as a housing for the finished unit.

What is claimed is:

1. A photoflash unit comprising:
a circuit board including an electrically insulative substrate member and lamp-firing circuitry on at least one surface of said substrate member, said substrate member including an opening therein located relative to said lamp-firing circuitry; and
at least one electrically-activated flashlamp including a light-transmitting envelope and a pair of electrically conductive lead-in wires projecting from said envelope, at least one of said lead-in wires electrically connected to said lamp-firing circuitry and including a looped portion frictionally positioned within said opening within said substrate member and projecting therefrom to secure said flashlamp to said substrate member.

2. The photoflash unit according to claim 1 wherein said looped portion of said lead-in wire projects from said opening to electrically contact said lamp-firing circuitry.

3. The photoflash unit according to claim 2 wherein said envelope of said flashlamp is located adjacent said surface of said circuit board having said lamp-firing circuitry thereon, said looped portion of said lead-in wire including an open end exiting said opening within said substrate member adjacent said envelope.

4. The photoflash unit according to claim 3 wherein said lead-in wire includes a substantially linear portion immediately projecting from said envelope and located at an angle with said looped portion, said linear portion traversing said open end of said looped portion.

5. The photoflash unit according to claim 2 including a second opening within said substrate member adjacent said opening having said looped portion therein, said lead-in wire including said looped portion being threaded through said second opening.

6. The photoflash unit according to claim 5 wherein said envelope of said flashlamp is located adjacent said surface of said circuit board having said lamp-firing circuitry thereon, the closed end of said looped portion of said lead-in wire exiting said opening within said substrate adjacent said envelope.

7. The photoflash unit according to claim 6 wherein said closed end of said looped portion extends from said opening and is crimped against said lamp-firing circuitry to electrically connect said lead-in wire thereto.

8. The photoflash unit according to claim 1 including a second opening within said substrate member adjacent said opening having said looped portion therein, said lead-in wire including a protruding offset portion which protrudes from said second opening, said offset portion electrically connected to said lamp-firing circuitry.

9. The photoflash unit according to claim 8 wherein said envelope of said flashlamp is located adjacent said surface of said circuit board having said lamp-firing circuitry thereon, the closed end of said looped portion of said lead-in wire exiting said opening within said substrate adjacent said envelope.

10. The photoflash unit according to claim 9 wherein the portion of said lead-in wire immediately projecting from said envelope substantially traverses said closed end of said looped portion.

11. The photoflash unit according to claim 9 wherein said substrate member includes a web portion located adjacent said opening having said looped portion therein, said web portion having at least part of said lamp-firing circuitry thereon, said closed end of said looped portion engaging said web portion of said substrate member to force said part of said lamp-firing circuitry located on said web portion against said offset portion of said lead-in wire.

* * * * *